United States Patent
Doo et al.

(10) Patent No.: US 10,236,045 B2
(45) Date of Patent: Mar. 19, 2019

(54) SEMICONDUCTOR MEMORY DEVICE HAVING DETECTION CLOCK PATTERNS PHASE-INVERTED FROM EACH OTHER AND DETECTION CLOCK GENERATING METHOD THEREOF

(71) Applicant: SAMSUNG ELECTRONICS CO., LTD., Suwon-si, Gyeonggi-Do (KR)

(72) Inventors: Su Yeon Doo, Seoul (KR); Seungjun Bae, Hwaseong-si (KR); Sihong Kim, Yongin-si (KR); Hosung Song, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 283 days.

(21) Appl. No.: 13/828,869

(22) Filed: Mar. 14, 2013

(65) Prior Publication Data

US 2014/0086002 A1    Mar. 27, 2014

Related U.S. Application Data

(60) Provisional application No. 61/704,135, filed on Sep. 21, 2012.

(30) Foreign Application Priority Data

Dec. 17, 2012  (KR) .................. 10-2012-0147510

(51) Int. Cl.
| | | |
|---|---|---|
| *G11C 7/00* | (2006.01) | |
| *G11C 8/18* | (2006.01) | |
| *G11C 5/04* | (2006.01) | |
| *G11C 7/22* | (2006.01) | |
| *G11C 11/4076* | (2006.01) | |
| *G06F 11/10* | (2006.01) | |
| *G11C 8/00* | (2006.01) | |
| *G11C 29/04* | (2006.01) | |

(52) U.S. Cl.
CPC ............ *G11C 8/18* (2013.01); *G06F 11/1004* (2013.01); *G11C 5/04* (2013.01); *G11C 7/22* (2013.01); *G11C 11/4076* (2013.01); *G11C 2029/0411* (2013.01)

(58) Field of Classification Search
CPC ....... G11C 7/222; G11C 7/22; G11C 11/4076; G11C 7/1066; G11C 8/18; G11C 7/1072; G11C 11/4096; G11C 29/023; G11C 7/1093; G11C 29/12015; G11C 2029/3602; G11C 29/56004; G11C 29/56012; G11C 2029/0411; G11C 2207/2281; G11C 16/32
USPC ............................................. 365/233.11, 193
See application file for complete search history.

(56) References Cited

U.S. PATENT DOCUMENTS

| | | |
|---|---|---|
| 6,301,682 B1 | 10/2001 | Knefel |
| 6,615,387 B1 | 9/2003 | Williamson et al. |
| 6,907,062 B2 | 6/2005 | Carlson |

(Continued)

*Primary Examiner* — Viet Q Nguyen
(74) *Attorney, Agent, or Firm* — F. Chau & Associates, LLC

(57) ABSTRACT

A clock pattern generating method of a semiconductor memory device is provided. The method includes generating the same clock pattern through a plurality of detection clock output pins when an output selection control signal is in a first state and generating clock patterns different from each other through the plurality of detection clock output pins when the output selection control signal is in a second state different from the first state.

19 Claims, 10 Drawing Sheets

(56) References Cited

U.S. PATENT DOCUMENTS

| | | | |
|---|---|---|---|
| 7,681,099 B2* | 3/2010 | Gorti et al. | 714/744 |
| 7,737,752 B2* | 6/2010 | Eaton et al. | 327/294 |
| 7,802,166 B2* | 9/2010 | Nygren | G06F 13/1668 714/6.2 |
| 7,921,318 B2* | 4/2011 | Kwan et al. | 713/500 |
| 8,014,485 B2* | 9/2011 | Kwan et al. | 375/376 |
| 8,112,680 B2* | 2/2012 | Chung | G06F 11/1008 714/701 |
| 8,169,851 B2* | 5/2012 | Chou | 365/233.11 |
| 8,321,779 B2* | 11/2012 | Shin | H03M 13/091 714/746 |
| 8,347,198 B2* | 1/2013 | Shin | G06F 11/1004 714/758 |
| 8,495,437 B2* | 7/2013 | Sohn | G11C 7/1063 714/718 |
| 8,812,928 B2* | 8/2014 | Ha | G06F 11/1004 714/758 |
| 9,104,571 B2* | 8/2015 | Ku | G06F 11/0772 |
| 9,201,725 B2* | 12/2015 | Yun | G06F 11/1004 |
| 9,213,657 B2* | 12/2015 | Zerbe | G06F 13/1689 |
| 9,280,415 B2* | 3/2016 | Ok | G06F 11/1004 |
| 9,564,206 B2* | 2/2017 | Shido | G11C 11/4093 |
| 9,619,316 B2* | 4/2017 | Bains | G06F 11/1004 |
| 2004/0044492 A1* | 3/2004 | Ichikawa | 702/118 |
| 2005/0262416 A1 | 11/2005 | Okamoto et al. | |
| 2006/0005095 A1* | 1/2006 | Ichikawa | 714/738 |
| 2007/0043999 A1 | 2/2007 | Ariyama | |
| 2007/0283297 A1* | 12/2007 | Hein et al. | 716/1 |
| 2008/0094117 A1* | 4/2008 | Stoler et al. | 327/162 |
| 2008/0130986 A1* | 6/2008 | Bae et al. | 382/159 |
| 2008/0225603 A1* | 9/2008 | Hein | 365/189.05 |
| 2009/0100285 A1* | 4/2009 | Bae | G06F 1/12 713/400 |
| 2009/0222707 A1* | 9/2009 | Shin et al. | 714/758 |
| 2009/0222713 A1* | 9/2009 | Shin | G06F 11/1004 714/807 |
| 2010/0118635 A1* | 5/2010 | Bae | G11C 7/1006 365/219 |
| 2010/0293393 A1* | 11/2010 | Park | G06F 12/0246 713/193 |
| 2011/0131467 A1 | 6/2011 | Weathers | |
| 2012/0113732 A1* | 5/2012 | Sohn | G11C 5/063 365/191 |
| 2012/0144278 A1* | 6/2012 | Park | 714/807 |
| 2012/0216095 A1* | 8/2012 | Ha | G06F 11/1004 714/758 |
| 2013/0055039 A1* | 2/2013 | Dearth | 714/720 |
| 2014/0086002 A1* | 3/2014 | Doo | G11C 8/18 365/233.11 |
| 2017/0004869 A1* | 1/2017 | Shin | G11C 11/4076 |
| 2018/0159558 A1* | 6/2018 | Cha | H03M 13/2906 |

* cited by examiner

| EDC 0 | EDC 1 | EDC 2 | EDC 3 |
|--------|-----------|--------|-----------|
| Mode 1 | inv MODE 1 | Mode 2 | inv MODE 2 |

SEMICONDUCTOR MEMORY DEVICE HAVING DETECTION CLOCK PATTERNS PHASE-INVERTED FROM EACH OTHER AND DETECTION CLOCK GENERATING METHOD THEREOF

CROSS-REFERENCE TO RELATED APPLICATIONS

This U.S. non-provisional application claims priority under 35 U.S.C. § 119 to U.S. provisional application No. 61/704,135 filed on Sep. 21, 2012 and to Korean Patent Application No. 10-2012-0147510 filed Dec. 17, 2012, in the Korean Intellectual Property Office, the disclosures of which are incorporated by reference herein in their entireties.

TECHNICAL FIELD

The inventive concept relates to a semiconductor memory device, and more particularly, to a volatile semiconductor memory device and a detection clock pattern generating method thereof.

DISCUSSION OF THE RELATED ART

A volatile semiconductor memory device such as a dynamic random access memory (DRAM) may be used as a data memory of an electronic system.

For example, a DRAM implemented according to the Graphics Double Data Rate version 5 (GDDR5) standard may be mounted on a graphic card of an electronic system. The GDDR5 DRAM may have error detection code (EDC) pins for outputting an EDC to support error detection and correction functions.

In a data access mode where data is read or data is written, a Cyclic Redundancy Check (CRC) code pattern may be output from the EDC pins to secure the reliability of data transmitted and received.

In an operation mode (e.g., a clocking mode) other than the data access mode, a detection clock pattern such as an EDC hold pattern may be output from the EDC pins to provide a Clock Data Recovery (CDR) function to a memory controller, a Graphics Processing Unit (GPU) or a Central Processing Unit (CPU).

SUMMARY

An exemplary embodiment of the inventive concept provides a clock pattern generating method of a semiconductor memory device which comprises generating the same clock pattern through a plurality of detection clock output pins when an output selection control signal is in a first state and generating clock patterns different from each other through the plurality of detection clock output pins when the output selection control signal is in a second state different from the first state.

In an exemplary embodiment of the inventive concept, in the second state, first clock patterns are output via a first group of the detection clock output pins, and second clock patterns are output via a second group of the detection clock output pins.

In an exemplary embodiment of the inventive concept, the first clock patterns include pseudo random binary pattern signals.

In an exemplary embodiment of the inventive concept, the pseudo random binary pattern signals have the same phase or have signals phases different from each other.

In an exemplary embodiment of the inventive concept, the second clock patterns include pseudo random binary pattern signals.

In an exemplary embodiment of the inventive concept, the pseudo random binary pattern signals have the same phase or have phases different from each other.

In an exemplary embodiment of the inventive concept, the plurality of detection clock output pins are error detection code pins.

In an exemplary embodiment of the inventive concept, the clock patterns different from each other are error detection code hold patterns.

In an exemplary embodiment of the inventive concept, the output selection control signal includes a mode register set signal.

In an exemplary embodiment of the inventive concept, the error detection code hold patterns are output via the error detection code pins for a clock data recovery function of a graphics processing unit.

In an exemplary embodiment of the inventive concept, the clock pattern is an error detection signal to detect an error state of data transmitted or received.

An exemplary embodiment of the inventive concept provides a semiconductor memory device which comprises a plurality of detection clock output pins and a clock pattern generating unit. The clock pattern generating unit generates the same clock pattern through the plurality of detection clock output pins when an output selection control signal is in a first state. The clock pattern generating unit generates clock patterns different from each other through the plurality of detection clock output pins when the output selection control signal is in a second state different from the first state.

In an exemplary embodiment of the inventive concept, in the second state, the clock pattern generating unit outputs first clock patterns via a first group of the detection clock output pins and second clock patterns via a second group of the detection clock output pins.

In an exemplary embodiment of the inventive concept, when the second clock patterns include pseudo random binary pattern signals, the second clock patterns have the same phase or have phases different from each other.

In an exemplary embodiment of the inventive concept, the output selection control signal includes a mode register set signal.

In an exemplary embodiment of the inventive concept, the semiconductor memory device is mounted as an element unit in a memory module including a plurality of semiconductor memory devices. The memory module is connected with a graphics processing unit.

According to an exemplary embodiment of the inventive concept, a semiconductor memory device includes a plurality of detection clock output pins and a clock pattern generating unit. The plurality of detection clock output pins include a first group of the detection clock output pins and a second group of the detection clock output pins. The clock pattern generating unit generates a first pair of clock patterns through the first group of the detection clock output pins and a second pair of clock patterns through the second group of the detection clock output pins. The first pair of clock patterns have a different waveform from a waveform of the second pair of clock patterns.

The first pair of clock patterns include the same phase, and the second pair of clock patterns include the same phase.

The first pair of clock patterns include different phases from each other, and the second pair of clock patterns include different phases from each other.

The first pair of clock patterns include differential signals, and the second pair of clock patterns include different signals.

Waveforms of the first and second pairs of clock patterns are controlled by an output selection control signal.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
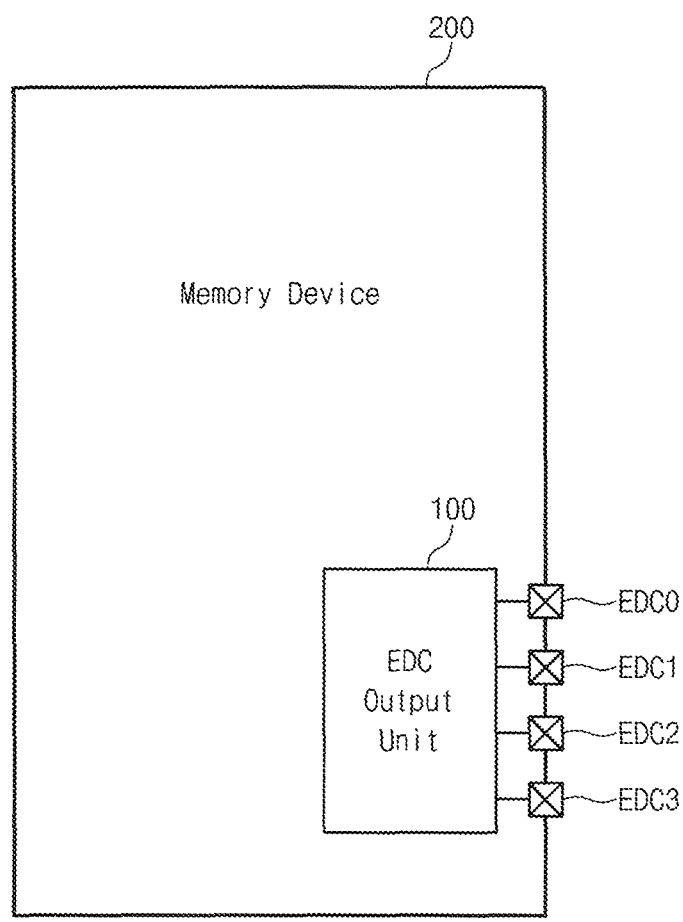
FIG. 1 is a block diagram illustrating a semiconductor memory device according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited to the embodiments set forth herein. Like reference numerals may denote like or similar elements throughout the drawings and the specification.

As used herein, the singular forms "a," "an" and "the" may include the plural forms as well, unless the context clearly indicates otherwise.

It will be understood that when an element or layer is referred to as being "on," "connected to," "coupled to," or "adjacent to" another element or layer, it can be directly on, connected, coupled, or adjacent to the other element or layer, or intervening elements or layers may be present.

FIG. 1 is a block diagram illustrating a semiconductor memory device according to an exemplary embodiment of the inventive concept.

Referring to FIG. 1, a semiconductor memory device 200 may include an error detection code (EDC) output unit 100 as a detection clock pattern generating unit.

When the semiconductor memory device 200 is a Dynamic Random Access Memory (DRAM) implemented according to the Graphics Double Data Rate, version 5 (GDDR5) standard, the semiconductor memory device 200 may be mounted on a graphic card of an electronic system. The GDDR5 DRAM may have EDC pins for outputting an EDC to support error detection and correction functions.

As shown in FIG. 1, the EDC output unit 100 may output an error detection code as a detection clock pattern via EDC pins EDC0, EDC1, EDC2, and EDC3.

Figure 2:
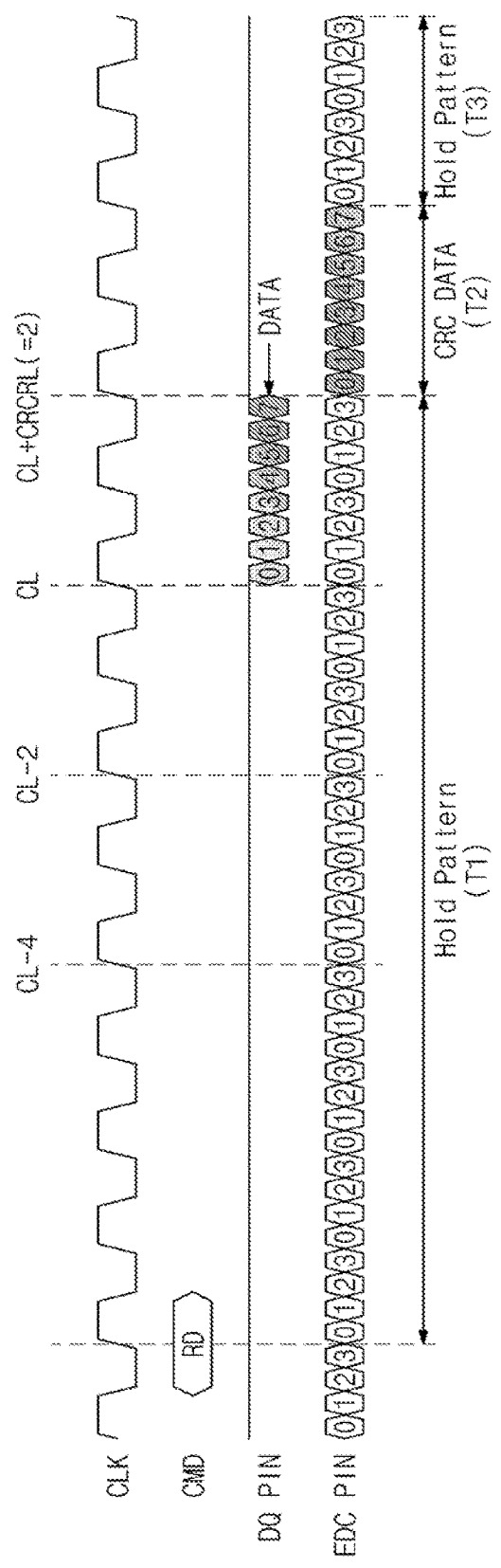
FIG. 2 is a timing diagram illustrating output patterns output from error detection code (EDC) pins in FIG. 1, according to an exemplary embodiment of the inventive concept.

FIG. 2 is a timing diagram illustrating output patterns output from the EDC pins in FIG. 1 according to an exemplary embodiment of the inventive concept.

FIG. 2 illustrates timings of output patterns output from the EDC pins when a read command RD is received in synchronization with a clock CLK by the semiconductor memory device 200 which may have a predetermined column address strobe (CAS) latency CL.

In a data access mode where data is read, a Cyclic Redundancy Check (CRC) code pattern may be output from the EDC pins during a time period T2 and may secure the reliability of data transmitted and received. Data may be output from data (DQ) pins of the semiconductor memory device 200 from a time corresponding to the CAS latency CL after the read command RD is generated. FIG. 2 illustrates an example in which data including data 0, 1, 2, 3, 4, 5, 6, and 7 is read from memory cells in response to the read command RD and is output via the data (DQ) pins.

In an operation mode (e.g., a clocking mode) other than the data access mode, a detection clock pattern such as an EDC hold pattern may be output from the EDC pins during time periods T1 and T3 and may provide a clock data recovery (CDR) function to a memory controller, a Graphics Processing Unit (GPU), or Central Processing Unit (CPU).

In a clocking mode, a clocking pattern may be repeatedly output via the EDC pins. FIG. 2 illustrates an example in which a data sequence of 0, 1, 2, and 3 is iteratively output. For example, a 4-bit clocking pattern is repeatedly output.

As described above, the EDC hold pattern may be output via the EDC pins during the time periods T1 and T3 in the clocking mode, and CRC data may be output via the EDC pins during the time period T2 in the data access mode.

Figure 3:
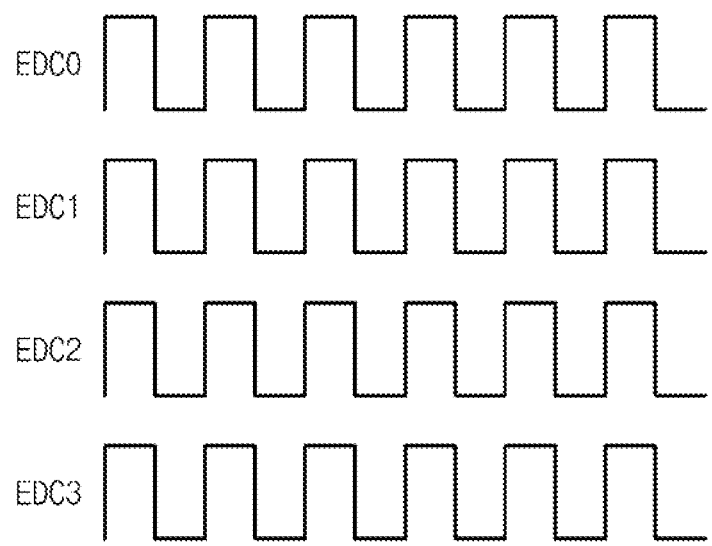
FIG. 3 is a waveform diagram illustrating a detection clock pattern.

FIG. 3 is a waveform diagram illustrating a detection clock pattern.

FIG. 3 illustrates EDC hold patterns output via EDC pins EDC0, EDC1, EDC2, and EDC3 (e.g., the EDC pins shown in FIG. 1) during time periods T1 and T3 (e.g., the time periods T1 and T3 shown in FIG. 2).

As illustrated in FIG. 3, the EDC hold patterns output via the EDC pins EDC0, EDC1, EDC2, and EDC3 may have the same or substantially the same waveform pattern.

The semiconductor memory device 200 as shown in FIG. 1 may be mounted on a memory module and may be connected with a GPU 300.

When EDC hold patterns have the same or substantially the same waveform, Electra-Magnetic Interference (EMI) may be increased due to interference between waveform signals.

Figure 4:
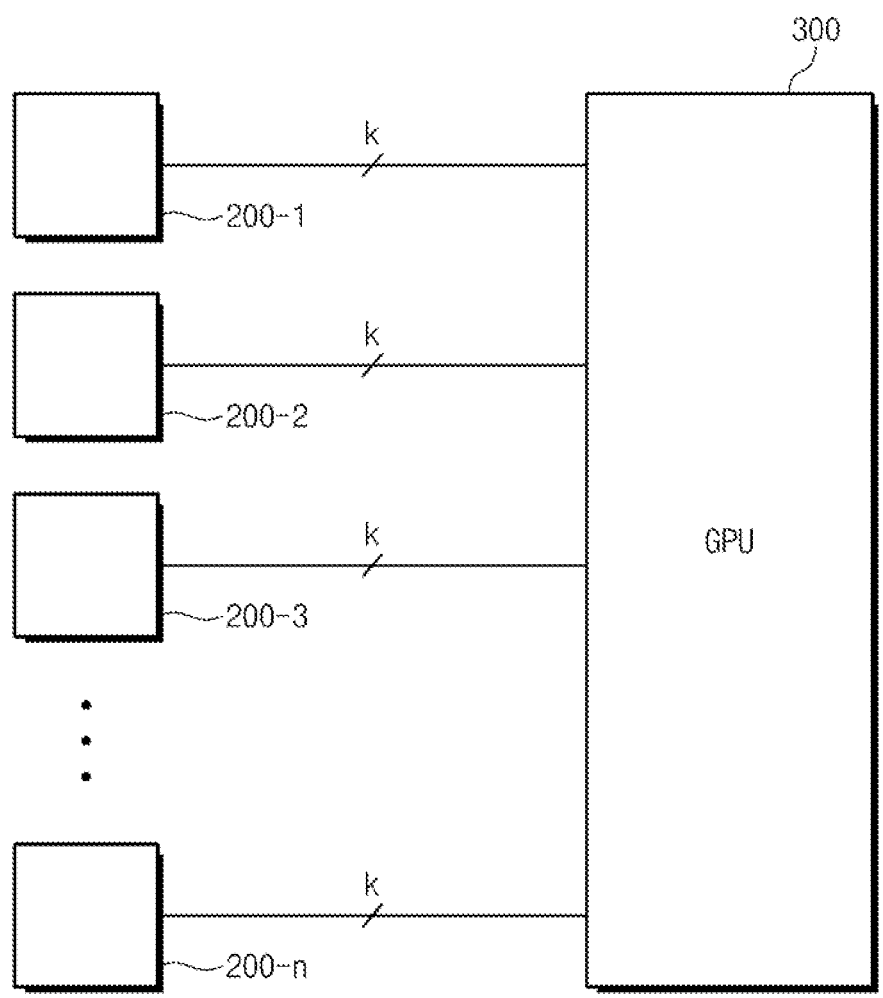
FIG. 4 is a block diagram illustrating a plurality of the semiconductor memory devices in FIG. 1 that are connected with a graphics processing unit in a memory module form, according to an exemplary embodiment of the inventive concept.

In an exemplary embodiment of the inventive concept, a detection clock pattern may be generated that may minimize or reduce EMI in a connection structure as shown in FIG. 4.

FIG. 4 is a block diagram illustrating a plurality of the semiconductor memory devices in FIG. 1 that are connected with a GPU in a memory module form according to an exemplary embodiment of the inventive concept.

Referring to FIG. 4, a GPU 300 may be connected with a plurality of semiconductor memory devices 200-1 to 200-n. The semiconductor memory devices 200-1 to 200-n may be mounted on a Printed Circuit Board (PCB) and may form a memory module.

The semiconductor memory device 200-1 may correspond to the semiconductor memory device 200 in FIG. 1. When the semiconductor memory device 200-1 has four EDC pins EDC0, EDC1, EDC2, and EDC3 like the semiconductor memory device 200 in FIG. 1, "k" in FIG. 4 may be 4. FIG. 4 illustrates an example in which the semiconductor memory devices 200-1 to 200-n are connected with the GPU 300 via EDC pins.

Figure 5:
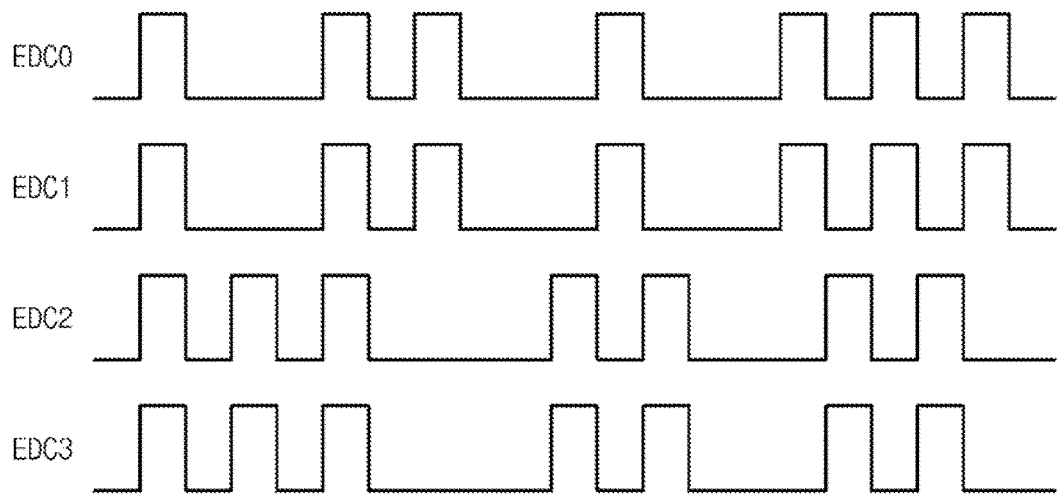
FIG. 5 is a waveform diagram illustrating detection clock patterns according to an exemplary embodiment of the inventive concept.
Figure 6:
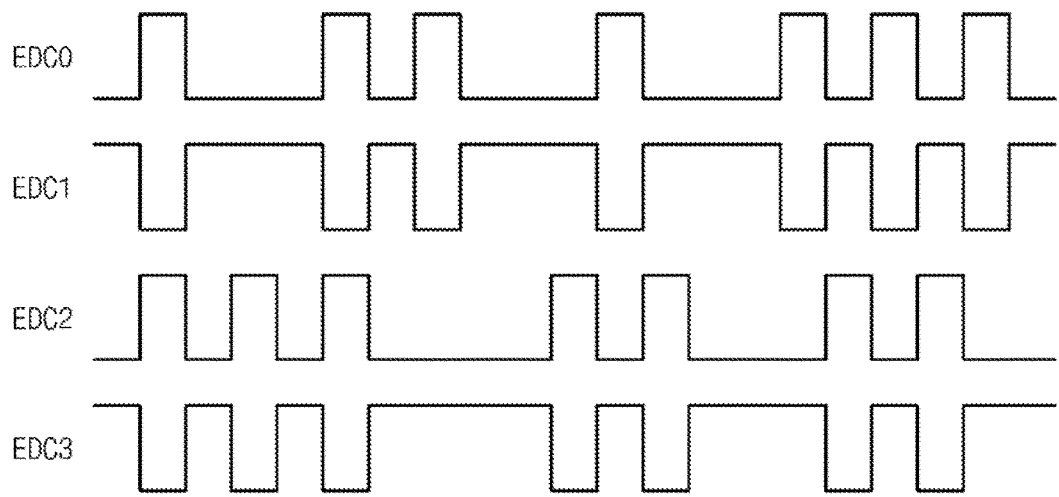
FIG. 6 is a waveform diagram illustrating detection clock patterns according to an exemplary embodiment of the inventive concept.

To reduce or minimize EMI in a connection structure as illustrated in FIG. 4, detection clock patterns may be generated as illustrated in FIGS. 5 and 6.

FIG. 5 is a waveform diagram illustrating detection clock patterns according to an exemplary embodiment of the inventive concept.

Referring to FIG. 5, first detection clock patterns (e.g., pattern waveforms EDC0 and EDC1) having the same or substantially the same signal waveform, may be output from two EDC pins EDC0 and EDC1 among four EDC pins EDC0, EDC1, EDC2, and EDC3. The EDC pins EDC0 and EDC1 may correspond to a first group of detection clock output pins.

Second detection clock patterns (e.g., pattern waveforms EDC2 and EDC3) having the same or substantially the same signal waveform may be output from two EDC pins EDC2 and EDC3 among the four EDC pins EDC0, EDC1, EDC2, and EDC3. The EDC pins EDC2 and EDC3 correspond to a second group of detection clock output pins.

Waveforms of the first detection clock patterns may be different from waveforms of the second detection clock patterns, thus reducing or minimizing the EMI.

In an exemplary embodiment of the inventive concept, the first detection clock patterns and the second detection clock patterns may be pseudo random binary pattern signals.

A plurality of detection clock output pins may be grouped. Detection clock patterns different from each other may be output as EDC hold patterns via the groups of detection clock output pins in a clocking mode. Thus, the EMI may be reduced. For example, when four detection clock output pins are provided for purposes of description, the four detection clock output pins may be divided into a first group constituted of two of the four detection clock output pins and a second group constituted of the other two. Each of the two detection clock output pins in the first group may output a first detection clock pattern, and each of the other two detection clock output pins in the second group may output a second detection clock pattern that is different in waveform from the first detection clock pattern.

FIG. 6 is a waveform diagram illustrating detection clock patterns according to an exemplary embodiment of the inventive concept.

Referring to FIG. 6, first detection clock patterns (e.g., pattern waveforms EDC0 and EDC1) may be output in a differential signal form from two EDC pins EDC0 and EDC1 among four EDC pins EDC0, EDC1, EDC2, and EDC3. The EDC pins EDC0 and EDC1 may correspond to a first group of detection clock output pins. For example, phases of the pattern waveforms EDC0 and EDC1 may be opposite to each other.

Second detection clock patterns (e.g., pattern waveforms EDC2 and EDC3) may be output in a differential signal form from two EDC pins EDC2 and EDC3 among the four EDC pins EDC0, EDC1, EDC2, and EDC3. The EDC pins EDC2 and EDC3 may correspond to a second group of detection clock output pins. For example, phases of the pattern waveforms EDC2 and EDC3 may be opposite to each other.

Waveforms of the first detection clock patterns may be different from waveforms of the second detection clock patterns, thus reducing or minimizing the EMI.

In an exemplary embodiment of the inventive concept, the first detection clock patterns and the second detection clock patterns may be pseudo random binary pattern signals.

As described above, a plurality of detection clock output pins may be grouped. Detection clock patterns different from each other may be output in a differential signal form via the groups of detection clock output pins in a clocking mode. Since distinct detection clock patterns are obtained via the EDC pins, the EMI may be further reduced.

The detection clock patterns illustrated in FIGS. 5 and 6 are provided as an example, and the inventive concept is not limited thereto.

The detection clock patterns illustrated in FIGS. 5 and 6 may be output under control of an output selection control signal. For example, when the output selection control signal is in a first state, the same or substantially the same detection clock pattern may be generated or output as illustrated in FIG. 3. When the output selection control signal is in a second state different from the first state, detection clock patterns different from each other may be generated or output as illustrated in FIGS. 5 and 6.

For example, the output selection control signal may include a mode register set signal, or for example, a state of the output selection control signal may be determined by a mode register set signal.

Thus, when the output selection control signal is in the second state, first detection clock patterns may be output via a first group of detection clock output pins of a plurality of detection clock output pins, and second detection clock patterns may be output via a second group of detection clock output pins of the plurality of detection clock output pins. Accordingly, the EMI may be minimized or reduced.

In an exemplary embodiment of the inventive concept, the first detection clock patterns may be signals having the same or substantially the same phase, or the first detection clock patterns may be signals having phases different from each other, e.g., differential signals having opposite phases to each other. The second detection clock patterns may be signals having the same or substantially the same phase or the second detection clock patterns may be signals having phases different from each other, e.g., differential signals having opposite phases to each other.

As suggested above, the signal waveforms of the detection clock patterns illustrated in FIGS. 5 and 6 are provided as an example, and the inventive concept is not limited thereto. For example, the signal waveforms of the detection clock patterns illustrated in FIGS. 5 and 6 may be changed or modified to other various forms.

Figure 7:
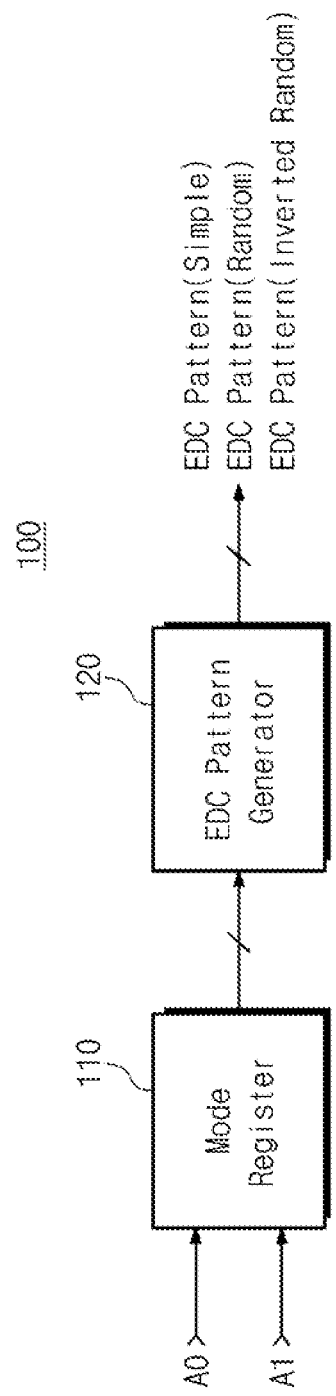
FIG. 7 is a block diagram illustrating an EDC output unit according to an exemplary embodiment of the inventive concept.

FIG. 7 is a block diagram illustrating an EDC output unit according to an exemplary embodiment of the inventive concept.

Referring to FIG. 7, an EDC output unit 100 may include a mode register 110 and an EDC pattern generator 120.

The mode register 110 may output a mode setting control signal according to logical states of address signals A0 and A1. The address signals A0 and A1 may be used as a mode register set signal. For example, when the address signals A0 and A1 have logical states "1" and "0", detection clock patterns as illustrated in FIG. 5 may be output. When the address signals A0 and A1 have logical states "1" and "1", detection clock patterns as illustrated in FIG. 6 may be output.

The EDC pattern generator 120 may output various EDC patterns in response to the mode setting control signal. For example, a simple pattern as shown in FIG. 3, a random pattern as shown in FIG. 5, and an inverted random pattern as shown in FIG. 6 may be selectively output according to a determined mode.

Figure 8:
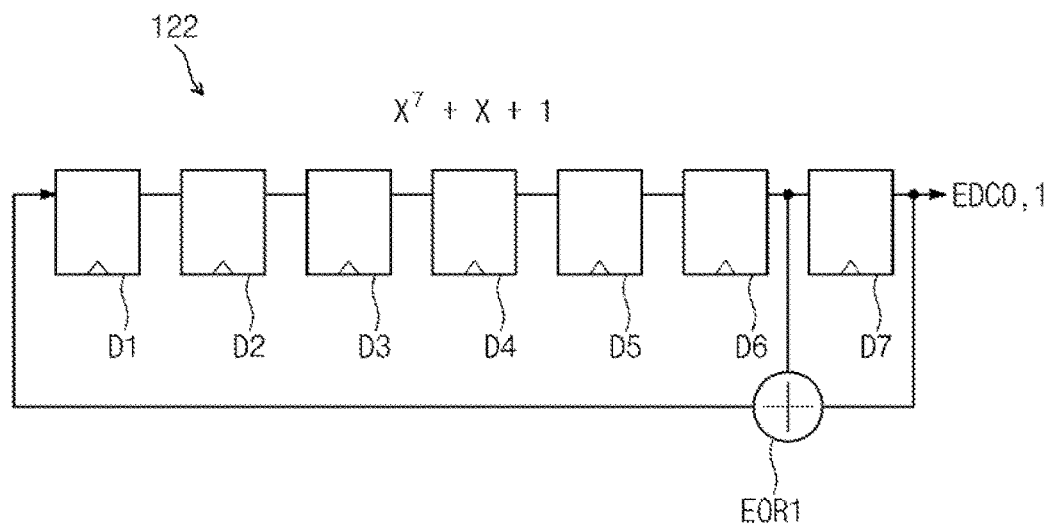
FIG. 8 is a diagram illustrating a random pattern generator of an EDC pattern generator according to an exemplary embodiment of the inventive concept.

FIG. 8 is a diagram illustrating a random pattern generator of an EDC pattern generator according to an exemplary embodiment of the inventive concept.

Referring to FIG. 8, a plurality of flip-flops D1 to D7 and an exclusive OR gate EOR1 may constitute a random pattern generator 122. The flip-flops D1 to D7 may constitute a linear feedback shift register. The random pattern generator 122 may generate ($2^n$−1) random patterns (n being the number of flip-flops). Thus, 127 pseudo random binary patterns may be generated according to a polynomial $X^7+X+1$.

First detection clock patterns such as pattern waveforms EDC0 and EDC1 shown in FIG. 5 may be obtained from an output of the flip-flop D7 of the random pattern generator 122.

Figure 9:
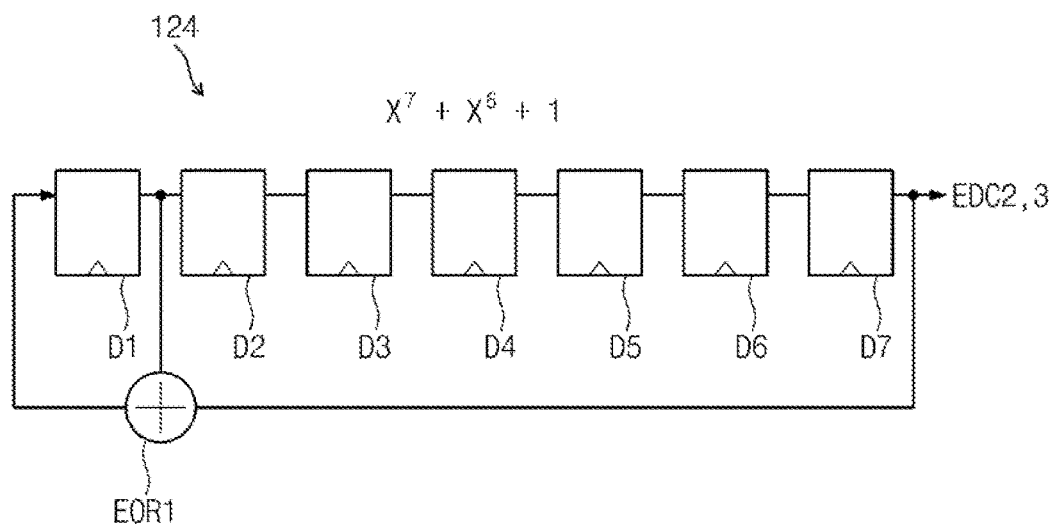
FIG. 9 is a diagram illustrating a random pattern generator of an EDC pattern generator according to an exemplary embodiment of the inventive concept.

FIG. 9 is a diagram illustrating a random pattern generator of an EDC pattern generator according to an exemplary embodiment of the inventive concept.

Referring to FIG. 9, a plurality of flip-flops D1 to D7 and an exclusive OR gate EOR1 may constitute a random pattern generator 124. The flip-flops D1 to D7 may constitute a linear feedback shift register. The random pattern generator 124 may generate ($2^n$−1) random patterns (n being the number of flip-flops). Thus, 127 pseudo random binary patterns may be generated according to a polynomial $X^7+X^6+1$. The random pattern generator 124 may be different from a random pattern generator 122 as shown in FIG. 8, e.g., in that the exclusive OR gate EOR1 of the random pattern generator 124 receives outputs of flip-flops D1 and D7.

Second detection clock patterns such as the pattern waveforms EDC2 and EDC3 in FIG. 5 may be obtained from an output of the flip-flop D7 of the random pattern generator 124.

Figures 10, 11:
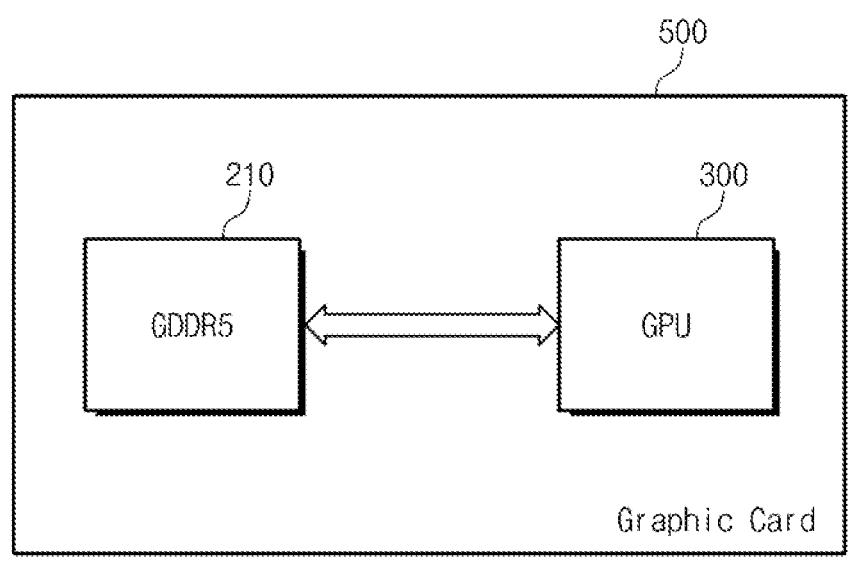
FIG. 10 is a table illustrating how output modes of detection clock patterns of EDC pin groups are set according to an exemplary embodiment of the inventive concept.
FIG. 11 is a block diagram illustrating a graphic card according to an exemplary embodiment of the inventive concept.

FIG. 10 is a table illustrating how output modes of detection clock patterns of EDC pin groups are set according to an exemplary embodiment of the inventive concept.

FIG. 10 illustrates a setting table for outputting inverted random patterns as shown in FIG. 6 under the condition that four EDC pins EDC0, EDC1, EDC2, and EDC3 are divided into two groups, e.g., first and second groups.

As shown in FIG. 10, of two EDC pins EDC0 and EDC1 in the first group of detection clock output pins, the EDC pin EDC0 may be set to a first mode, and the EDC pin EDC1 may be set to a first inverted mode. In this case, first detection clock patterns such as the pattern waveforms EDC0 and EDC1 shown in FIG. 6 may be output in a differential signal form.

As further shown in FIG. 10, of two EDC pins EDC2 and EDC3 in the second group of detection clock output pins, the EDC pin EDC2 may be set to a second mode, and the EDC pin EDC3 may be set to a second inverted mode. In this case, second detection clock patterns such as the pattern waveforms EDC2 and EDC3 shown in FIG. 6 may be output in a differential signal form.

FIG. 11 is a block diagram illustrating a graphic card according to an exemplary embodiment of the inventive concept.

Referring to FIG. 11, a graphic card 500 may include a GDDR5 DRAM 210 and a GPU 300. The GDDR5 DRAM 210 may be formed of the semiconductor memory device 200 as illustrated in FIG. 1, and the EMI of the graphic card is reduced or minimized.

The GDDR5 DRAM 210 may have a capacity of 1 GB, a 128-bit memory interface, a bandwidth of 86.4 GB/s, and a clock of 5400 (1350) MHz. For example, GeForce™ series commercially available from Nvidia and Radeon™ series commercially available from Advanced Micro Devices (AMD) may be applicable to the GPU 300. For example, any GPU commercially available from Intel may be applicable to the GPU 300.

Chips of the graphic card 500 may be mounted using various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-Level Processed Stack Package (WSP), and so on.

Figure 12:
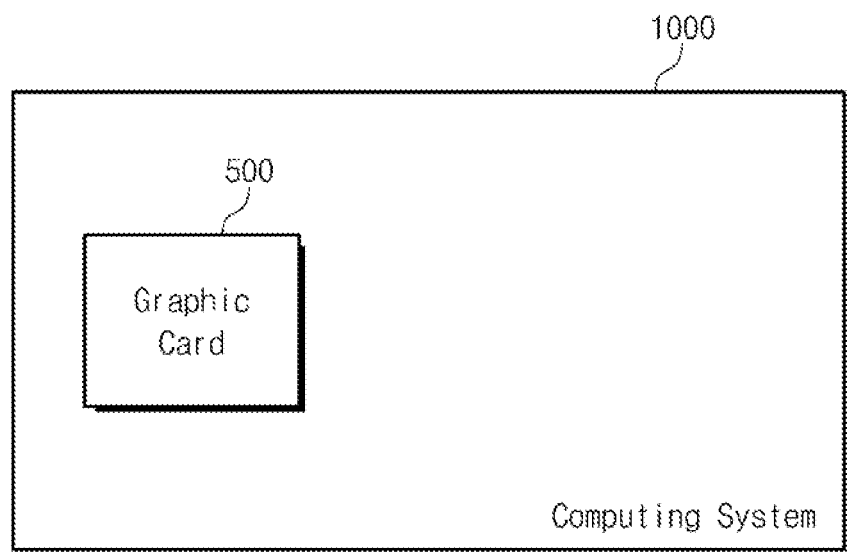
FIG. 12 is a block diagram illustrating a computing system according to an exemplary embodiment of the inventive concept.

FIG. 12 is a block diagram illustrating a computing system according to an exemplary embodiment of the inventive concept.

Referring to FIG. 12, a computing system 1000 may include a graphic card 500. The graphic card 500 may be a graphic card 300 as illustrated in FIG. 11. Since the graphic card described above in connection with FIG. 11 is applicable to the computing system 1000, the EMI of the computing system 1000 may be reduced.

The computing system 1000 may further include a CPU, a user interface (UI), a memory control unit (e.g., Core™ i5-3470T (2.9 GHz)), a memory module (e.g., 8 GB DDR3 (4GX2)), and so on. The computing system 1000 may use Window 8™ (64 Bit) as an operating system. The computing system 1000 may further comprise a Hard Disk Drive (HDD) having a capacity of 1 TB (e.g., SATA2).

The computing system 1000 may include AMD Radeon™ HD7690M GDDR5 1 GB as the graphic card 500.

The above-described configuration of the computing system 1000 is provided as an example, and the inventive concept is not limited thereto.

A semiconductor memory of a memory module may include a memory cell array. The memory cell array may include a normal cell block having normal memory cells connected with normal word lines and a spare cell block having redundancy memory cells connected with spare word lines. In the normal memory cell block and the redundancy memory cell block, a unit memory cell may be a DRAM memory cell formed of an access transistor and a storage capacitor. Each of the normal memory cell block and the redundancy memory cell block may include memory cells arranged in a matrix of rows and columns.

The computing system 1000 may be connected with an external communications device via a separate interface. The communications device may include a digital versatile disk (DVD) player, a computer, a set top box (STB), a game machine, a digital camcorder, and so on.

When the computing system 1000 is a mobile device, the computing system 1000 may further comprise an application chipset, a camera image processor (CIS), a mobile DRAM, and so on.

The computing system 1000 may include a solid state drive (SSD) which includes nonvolatile storage as mass storage.

The nonvolatile storage may be used to store data information having a variety of data forms such as text, graphics, software codes, and so on.

The nonvolatile storage may include an Electrically Erasable Programmable Read-Only Memory (EEPROM), a flash memory, a magnetic RAM (MRAM), a Spin-Transfer Torque MRAM, a Conductive bridging RAM (CBRAM), a Ferroelectric RAM (FeRAM), a Phase change RAM (PRAM) called Ovonic Unified Memory (OUM), a Resistive RAM (RRAM or ReRAM), a Nanotube RRAM, a Polymer RAM (PoRAM), a Nano Floating Gate Memory (NFGM), a holographic memory, a molecular electronics memory device, an insulator resistance change memory, and so on.

Figure 13:
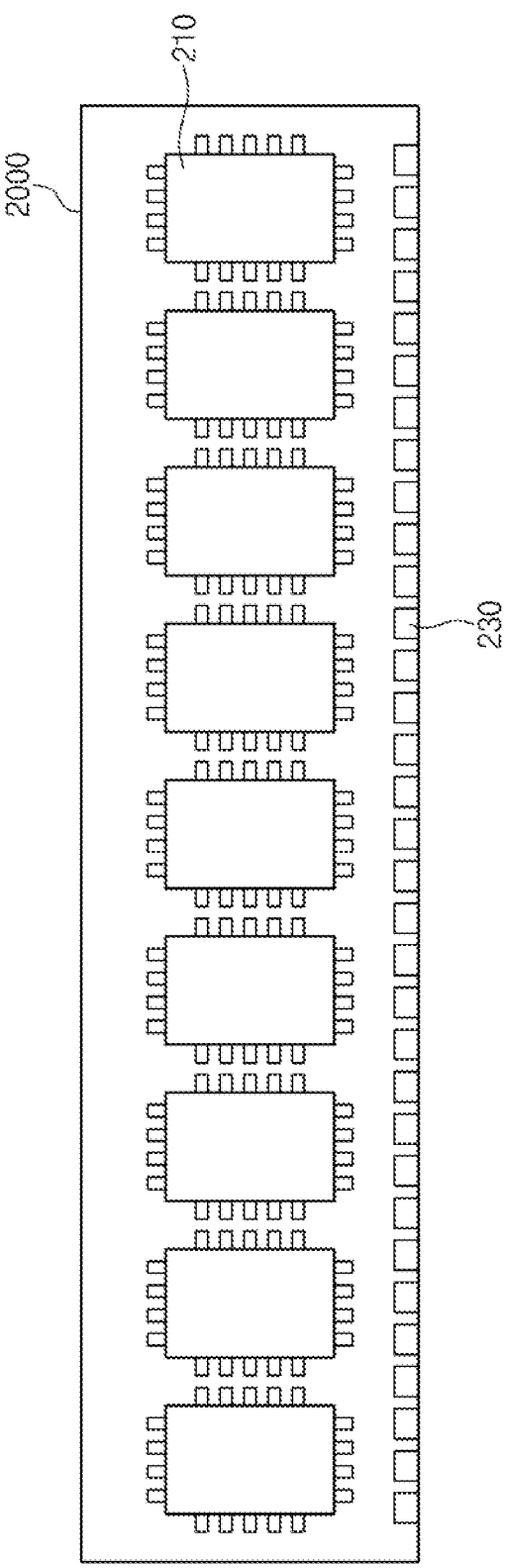
FIG. 13 is a diagram illustrating a memory module according to an exemplary embodiment of the inventive concept.

FIG. 13 is a diagram illustrating a memory module according to an exemplary embodiment of the inventive concept.

Referring to FIG. 13, a memory module 2000 may include a plurality of memory chips 210 and a plurality of external terminals 230. Each of the memory chips 210 may be formed of the semiconductor memory device 200 shown in FIG. 1 according to an exemplary embodiment of the inventive concept. The external terminals 230 may receive a control signal, an address signal, and data from a computing system to be transferred to the memory module 2000. The external terminals 230 may transfer data stored in each memory chip 210 to a display device of the computing system.

Since the memory module 2000 includes a memory chip 210 that may be formed of the semiconductor memory device 200 described above with reference to FIG. 1, the EMI of the memory module 2000 may be reduced or minimized.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A graphic memory comprising:
    a data pin (DQ) outputting read data in response to a read command;
    a first error detection code (EDC) pin outputting first cyclic redundancy check (CRC) data during a second time period, and outputting a first EDC pattern during a first time period and a third time period respectively;
    a second error detection code (EDC) pin outputting second cyclic redundancy check (CRC) data during the second time period, and outputting a second EDC pattern during the first time period and the third time period respectively;
    a mode register configured to output a mode setting control signal; and
    an EDC pattern generator coupled to the first and second error detection code pins and configured to generate the first and second EDC patterns,
    wherein the first and second EDC patterns are random patterns when the mode setting control signal is a first level and hold patterns when the mode setting control signal is a second level, and the second level is different from the first level, and
    wherein the second EDC pattern is an inverted pattern of the first EDC pattern.

2. The graphic memory device of claim 1,
    wherein the EDC pattern is provided to a graphic processing unit (GPU) for a clock-data recovery (CDR) function,
    wherein the EDC pattern generator comprises a plurality of flip-flops and an exclusive OR gate, wherein the flip-flops are connected in series and outputs of two flip-flops among the plurality of flip-flops are inputted to the exclusive OR gate,
    wherein the EDC pattern generator generates 2n−1 random patterns, and
    wherein n is the number of flip-flops.

3. A graphic memory system comprising:
    a graphic memory device comprising:
        a data pin (DQ) outputting read data in response to a read command;
        a first error detection code (EDC) pin outputting a cyclic redundancy check (CRC) data during a first time period, and outputting an EDC pattern during a second time period and a third time period;
        a mode register configured to output a mode setting control signal; and
        an EDC pattern generator coupled to the first error detection code pin and configured to generate the EDC pattern; and
    a graphic processing unit (GPU) connected to the graphic memory device and configured to send the read command and receive the read data,
    wherein the EDC pattern is a random pattern when the mode setting control signal is a first level and a hold pattern when the mode setting control signal is a second level, and the second level is different from the first level.

4. The graphic memory system of claim 3, wherein the hold pattern is a simple data pattern stored in the memory device and the random pattern is a pseudo random data pattern generated by a random pattern generator included in the EDC pattern generator.

5. The graphic memory system of claim 4,
    wherein the second time period starts after outputting the read data,
    wherein the second period is after the first period and before the third period.

6. The graphic memory device of claim 5, further includes a second EDC pin coupled to the EDC pattern generator, the second EDC pin outputting a second EDC pattern which is identical in phase with the EDC pattern.

7. The graphic memory device of claim 4, further includes a second EDC pin coupled to the EDC pattern generator, the second EDC pin outputting a second EDC pattern which is an inverted pattern of the EDC pattern.

8. The graphic memory device of claim 3, wherein the EDC pattern is provided to a graphic processing unit (GPU) for a clock-data recovery (CDR) function.

9. A dynamic random access memory (DRAM) device comprising:
- a data pin (DQ) outputting read data in response to a read command;
- a first error detection code (EDC) pin outputting a cyclic redundancy check (CRC) data during a second time period, and outputting an EDC pattern during a first time period and a third time period respectively;
- a mode register configured to output a mode setting control signal; and
- an EDC pattern generator coupled to the first error detection code pin and configured to generate the EDC pattern,
- wherein the EDC pattern is a random pattern when the mode setting control signal is a first level and a hold pattern when the mode setting control signal is a second level, and the second level is different from the first level.

10. The DRAM device of claim 9, wherein the hold pattern is a simple data pattern stored in the memory device and the random pattern is a pseudo random data pattern generated by a random pattern generator included in the EDC pattern generator.

11. The DRAM device of claim 10, wherein the second time period starts after outputting the read data.

12. The DRAM device of claim 11, wherein the read data is outputted after a column address strobe (CAS) latency from the read command.

13. The DRAM device of claim 12,
- wherein the CRC data is output immediately after outputting the read data, and
- wherein the second time period is after the first time period and before the third time period.

14. The DRAM device of claim 13, further includes a second EDC pin coupled to the EDC pattern generator, the second EDC pin outputting a second EDC pattern which is identical in phase with the EDC pattern.

15. The DRAM device of claim 13, further includes a second EDC pin coupled to the EDC pattern generator, the second EDC pin outputting a second EDC pattern which is inverted data pattern of the EDC pattern.

16. The DRAM device of claim 14 or claim 15, wherein the mode register is further configured to output a second mode setting control signal which determines whether the second EDC pattern is inverted or not.

17. The DRAM device of claim 9, wherein the EDC pattern is provided to a memory controller for a clock-data recovery (CDR) function.

18. The DRAM device of claim 17, wherein the EDC pattern generator comprises a plurality of flip-flops and an exclusive OR gate, wherein the flip-flops are connected in series and outputs of two flip-flops among the plurality of flip-flops are inputted to the exclusive OR gate.

19. The DRAM device of claim 18, wherein the EDC pattern generator generates $2n-1$ random patterns, wherein n is the number of flip-flops.

* * * * *